(12) United States Patent  
Latypov et al.

(10) Patent No.: US 7,580,559 B2
(45) Date of Patent: Aug. 25, 2009

(54) SYSTEM AND METHOD FOR CALIBRATING A SPATIAL LIGHT MODULATOR

(75) Inventors: Azat M. Latypov, Danbury, CT (US); Sherman K. Poultney, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 784 days.

(21) Appl. No.: 10/765,948

(22) Filed: Jan. 29, 2004

(65) Prior Publication Data

US 2005/0168790 A1 Aug. 4, 2005

(51) Int. Cl.
*G06K 9/00* (2006.01)
*G06K 9/20* (2006.01)
*G03C 5/00* (2006.01)
*G02B 26/00* (2006.01)

(52) U.S. Cl. .................. 382/152; 382/286; 430/30; 359/290

(58) Field of Classification Search .................. 382/152
See application file for complete search history.

(56) References Cited

U.S. PATENT DOCUMENTS

| 4,904,068 | A | * | 2/1990 | Tatsuno et al. ............... 359/559 |
| 5,229,872 | A | | 7/1993 | Mumola |
| 5,253,236 | A | * | 10/1993 | Latta et al. ............... 369/44.24 |
| 5,296,891 | A | | 3/1994 | Vogt et al. |
| 5,500,736 | A | | 3/1996 | Koitabashi et al. |
| 5,515,158 | A | * | 5/1996 | Heineck ...................... 356/129 |
| 5,523,193 | A | | 6/1996 | Nelson |
| 5,530,482 | A | | 6/1996 | Gove et al. |
| 5,579,147 | A | | 11/1996 | Mori et al. |
| 5,610,897 | A | * | 3/1997 | Yamamoto et al. ..... 369/124.03 |

(Continued)

FOREIGN PATENT DOCUMENTS

EP 1 482 375 A2 12/2004

(Continued)

OTHER PUBLICATIONS

English Abstract for Publication No. JP2000-293885A published Oct. 20, 2000 (retrieved from the esp@cenet database).

(Continued)

*Primary Examiner*—Bhavesh M Mehta
*Assistant Examiner*—David P Rashid
(74) *Attorney, Agent, or Firm*—Sterne, Kessler, Goldstein & Fox P.L.L.C.

(57) ABSTRACT

A method and system as used to calibrate a reflective SLM. The system can include the SLM having an array of pixels and a projection optical system resolving individual pixels and having an apodized pupil. During a calibration operation, the pixels of the SLM receive varying voltage values to move them through various angles. Light reflecting from the pixels during these movements forms individual images for each pixel at each angle. The light passes through the apodized pupil and is received on one or more sections of a detector. The apodization pattern is selected so that individual pixels remain well resolved with strong sensitivity to the pixel mirror tilt. The light intensity received for each pixel at each angle is correlated to the voltage value received at the pixel to tilt the pixel to that angle producing a result signal used by a control device to calibrate the SLM.

16 Claims, 7 Drawing Sheets

U.S. PATENT DOCUMENTS

| | | | |
|---|---|---|---|
| 5,677,703 A | 10/1997 | Bhuva et al. | |
| 5,754,294 A * | 5/1998 | Jones et al. | 356/503 |
| 5,756,981 A * | 5/1998 | Roustaei et al. | 235/462.42 |
| 5,808,797 A | 9/1998 | Bloom et al. | |
| 5,965,330 A * | 10/1999 | Evans et al. | 430/321 |
| 5,982,553 A | 11/1999 | Bloom et al. | |
| 6,014,360 A * | 1/2000 | Yonekubo et al. | 369/112.16 |
| 6,133,986 A | 10/2000 | Johnson | |
| 6,177,980 B1 | 1/2001 | Johnson | |
| 6,369,879 B1 * | 4/2002 | Pedersen | 356/3.01 |
| 6,377,295 B1 * | 4/2002 | Woodgate et al. | 348/59 |
| 6,399,261 B1 * | 6/2002 | Sandstrom | 430/30 |
| 6,670,986 B1 * | 12/2003 | Shoshan et al. | 348/219.1 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,847,461 B1 | 1/2005 | Latypov et al. | |
| 2003/0081303 A1 | 5/2003 | Sandstrom et al. | |
| 2003/0137659 A1 | 7/2003 | Milshtein | |
| 2004/0041104 A1 | 3/2004 | Liebregts et al. | |
| 2004/0130561 A1 | 7/2004 | Jain | |

FOREIGN PATENT DOCUMENTS

| | | |
|---|---|---|
| JP | 6-186504 A | 7/1994 |
| JP | 8-241526 A | 9/1996 |
| JP | 2000-293885 A | 10/2000 |
| JP | 2002-372790 A | 12/2002 |
| WO | WO 98/33096 | 7/1998 |
| WO | WO 98/38597 | 9/1998 |
| WO | WO 03/040830 A2 | 5/2003 |
| WO | WO 03/046665 A1 | 6/2003 |

OTHER PUBLICATIONS

Translation for Office Action and Office Action for Japanese Patent Application No. 2005-024275 mailed Mar. 4, 2008, 8 pgs.

* cited by examiner

SYSTEM AND METHOD FOR CALIBRATING A SPATIAL LIGHT MODULATOR

BACKGROUND OF THE INVENTION

1. Field of the Invention

The present invention is related to calibrating spatial light modulators having reflective pixels, and more particularly to calibrating reflective spatial light modulators utilized in maskless lithography systems.

2. Background Art

Spatial light modulators (SLMs) (e.g., digital mirror devices (DMDs), liquid crystal displays (LCDs), grating light valves (GLVs), or the like) are used in many different environments to pattern objects or project patterns, for example, lithography (e.g., maskless lithography), televisions, biomedical systems, biotechnology systems, etc. SLMs can include an active area having an n×m (wherein n and m are integers equal to or greater than 1) array of active devices (or pixels) (e.g., an array of mirrors on the DMD or GLV or an array of reflective/transmissive devices on the LCD). Each active device is individually controlled to move (e.g., tilt, rotate, pivot, etc.) the active devices between ON and OFF through one or more discrete states. For example, if the active devices are mirrors on the DMD or GLV, each of the mirrors is individually controlled to rotate or bend between binary or multiple positions.

FIGS. 1, 2, and 3 show conventional systems 100, 200, and 300, respectively, for illuminating an SLM array, so that patterned light is formed and directed from the SLM array towards a substrate. As is known, the illumination optics and the SLM optics can include one or more optical elements (e.g., lenses, mirrors, etc.).

As discussed above, one application for an SLM, or an array thereof, is in maskless lithography. Lithography is a process used to create features on the surface of a substrate. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image (e.g., a pattern) formed by the SLM, or array thereof. The image is projected onto the surface of the wafer by exposure optics located within a lithography apparatus. While exposure optics are used in the case of photolithography, a different type of exposure apparatus can be used depending on the particular application. For example, an eximer laser, x-ray, ion, electron, or photon lithography can each require a different exposure apparatus, as is known to those skilled in the art. The particular example of photolithography is discussed here for illustrative purposes only.

The projected image produces changes in the characteristics of a layer (e.g., photoresist) deposited on the surface of the wafer. These changes correspond to features in the image projected onto the wafer during exposure. Subsequent to exposure, the layer can be processed to produce a patterned layer. The pattern corresponds to the features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time with the image formed by the SLM, individual fields are scanned onto the wafer one at a time. This is accomplished by moving the wafer and controlling active devices on the SLM, such that the imaging slot is moved across the field during the scan. The wafer stage must then be stepped between field exposures to allow multiple copies of the pattern formed by the active devices on the SLM to be exposed over the wafer surface. In this manner, the quality of the image projected onto the wafer is maximized.

In order to ensure patterning is accurate, control of the active devices must be accurate. The accuracy is based on calibrating the active devices. One method uses individual calibration of the SLM pixels, which requires the capability to measure the tilt of each pixel resulting from a certain voltage applied to the pixel. However, viewing one pixel at a time by turning off all other pixels is not desirable because the calibration time becomes prohibitive.

Another calibration method is based on imaging all pixels of the SLM array on a CCD array using projection optics of the lithography tool to resolve each pixel. The light reflected from each pixel is then mostly concentrated within the bounds of the pixel's geometrical image. The problem of such an approach is that the image of the tilting micro-mirror pixel produced by the projection optics resolving this pixel does not depend (or depends very weakly) on the pixel mirror tilt. The modulation of the tilting mirror pixel image is based on the fact that the tilting mirror pixel deflects the portion of light that falls on it away from the projection optics entrance. This modulation therefore depends on the object size numerical aperture (NA) of the projection optics. The imaging projection optics, used to project the image of the SLM onto the substrate, samples the fraction of the zero order diffraction lobe from the pixel (thus the pixel is sub-resolution when it is imaged during printing). The calibration projection optics resolving the pixel has to capture many diffraction lobes from the pixel. Therefore, tilting the pixel within the range of the tilt angles of interest would not result in a significant modulation of the resolved image of the pixel. Resolution of the individual tilting mirror pixel and the (strong) modulation of the resolved image depending on the tilt are both required for the calibration, but these properties are mutually exclusive, as explained above.

Therefore, what is needed is a system and method that allows for calibration of all individual pixels in an SLM substantially simultaneously, while still allowing for images of the pixels to be well resolved and to allow each image to strongly modulate with movement (e.g., tilting, pivoting, rotating, etc.) of the pixel. In this way the image of the pixels depends strongly on the movement of the pixels.

BRIEF SUMMARY OF THE INVENTION

Embodiments of the present invention provide a method for calibrating a spatial light modulator (SLM) including at least the following steps. Applying a voltage having a voltage value to pixels in a spatial light modulator (SLM) to move (e.g., tilt, rotate, pivot, etc.) the pixels. Reflecting light from the moved pixels. Passing the reflected light through an apodized pupil in an optical system. Capturing an image from the light after it passes through the apodized pupil. Correlating the image and the voltage value to generate a result signal. Calibrating the pixels using the result signal.

Other embodiments of the present invention provide a system for calibrating an SLM. The system includes a device for applying a voltage having a voltage value to pixels in a spatial light modulator (SLM) to move the pixels, a device for apodizing a pupil in an optical system, a device for capturing an image from light that has reflected off the SLM and passed through the apodizing means, a device for correlating the image and the voltage value to generate a result signal, and a device for calibrating the pixels using the result signal.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 1, 2, and 3 show conventional systems for illuminating an SLM array to pattern a substrate.

Figure 1:
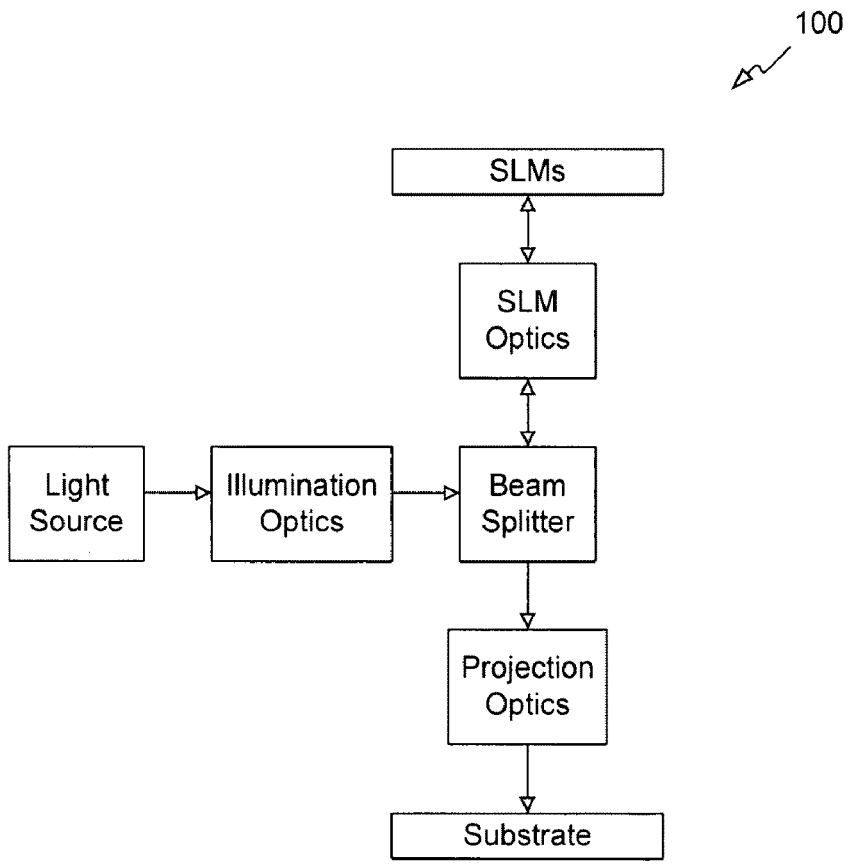
Figure 2:
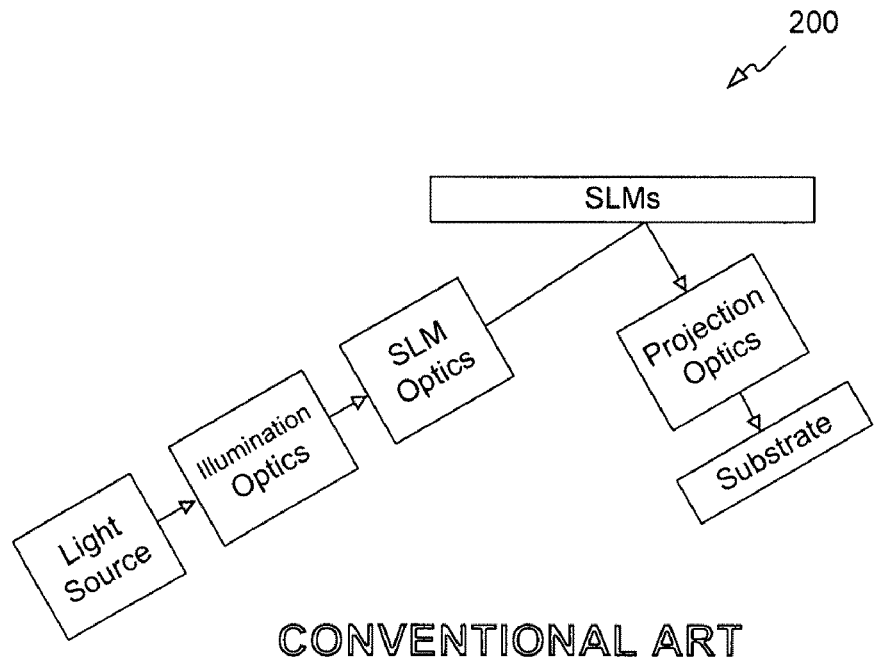
Figure 3:
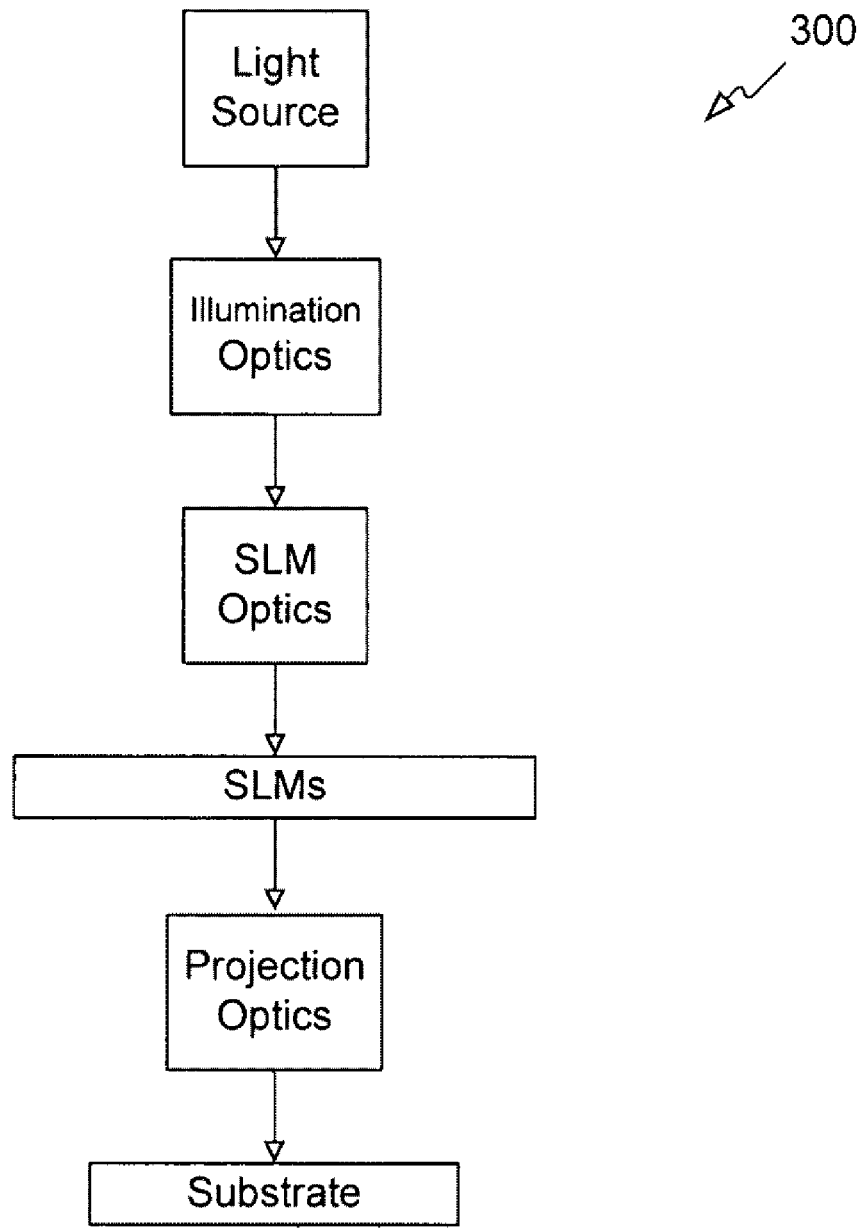

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Embodiments of the present invention provide a method and system including a reflective SLM having an array of pixels (e.g., mirrors) and a projection optical system having an apodized pupil. During a calibration operation, the mirrors of the SLM receive varying voltage values to either continuously or incrementally move (e.g:, movement can be to tilt, pivot, rotate, etc., hereinafter all are referred to as "move") them through various angles. Light reflecting from each of the pixels during these movements forms individual images for each pixel at each angle. The light then passes through the apodized pupil and is received on one or more sections (e.g., pixels) of a detector (e.g., a CCD array). The light intensity received for each pixel at each angle is correlated to the voltage value received at the pixel to tilt the pixel to that angle. The correlation produces a result signal. The result signal is used by a control device before and possibly during normal operation of the SLM to calibrate the SLM one or more times.

Exemplary DMD SLM

Figure 4:
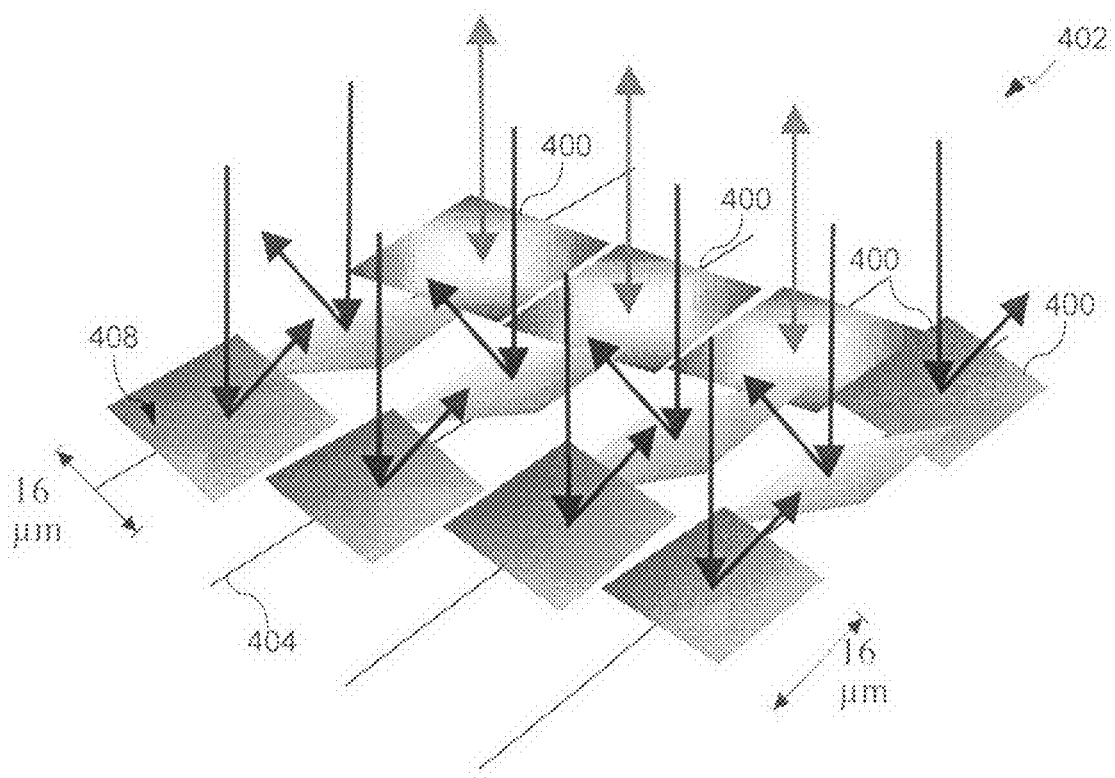
FIG. 4 shows a perspective view of mirrors for a section of a DMD SLM according to embodiments of the present invention.

FIG. 4 shows a perspective view of a set of mirrors 400 on a portion of a DMD SLM 402. SLM 402 can be used in any of systems 100, 200, or 300. When a DMD is used as the SLM 402, it can include 16×16 μm² tilting mirrors 400 arranged in a 2048×512 array, for example. It is to be appreciated that other sized arrays can also be used, and are contemplated within the scope of the present invention. Further, arrays of SLMs could also be used, as would be apparent to one of ordinary skill in the art upon reading this description. The pixels 400 of the SLM of interest are driven electrostatically with each micro-mirror 400 capable of varying its tilt, depending on the voltage applied to each mirror 400 via a circuit (not shown). For example, the circuit can include a capacitive coupling (not shown) controlled using a transistor (not shown). In this example, a typical pixel is controlled in a fashion similar to how parallel plates in a capacitor are controlled, in other words, a capacitive coupling is used to control the tilt of mirrors 400 using electrostatic forces. Mirrors 400 tilt (e.g., rotate, move, etc.) around support 404 based on energy being applied to or not-applied to a plate (not shown) in the circuit and proximate mirror 400. The movement can be binary (e.g., ON and OFF) or through multiple angles. In a lithography environment, or the like, using multiple angles can enhance gray scaling of patterned features.

Because of the variations of the mechanical properties and the geometry from one pixel 400 to another, the dependence between the voltage applied from via the circuit for each pixel 400 and its resulting tilt is different for different pixels 400. Furthermore, the reflective pixel surface 408 bends, in addition to the principal deformation effect (the tilt). Deformation of the reflective surface 408 affects the pixel images to a much lesser extent, compared to the tilt. This deformation (varying non-planarity) can be significantly reduced as a result of smaller pixel sizes, thicker pixel mirrors, better pixel materials, and better design of the pixel mirror "hinge." To ensure the image quality, the pixels 400 need to be individually calibrated. This calibration usually occurs before operation of a system including SLM 402 and possibly periodically during operation of a system including SLM 402 in the field to account for the changes in the mechanical properties of the pixels 400 occurring with time and to detect the deficient pixels.

Exemplary Method of Calibration a DMD SLM

Figure 5:
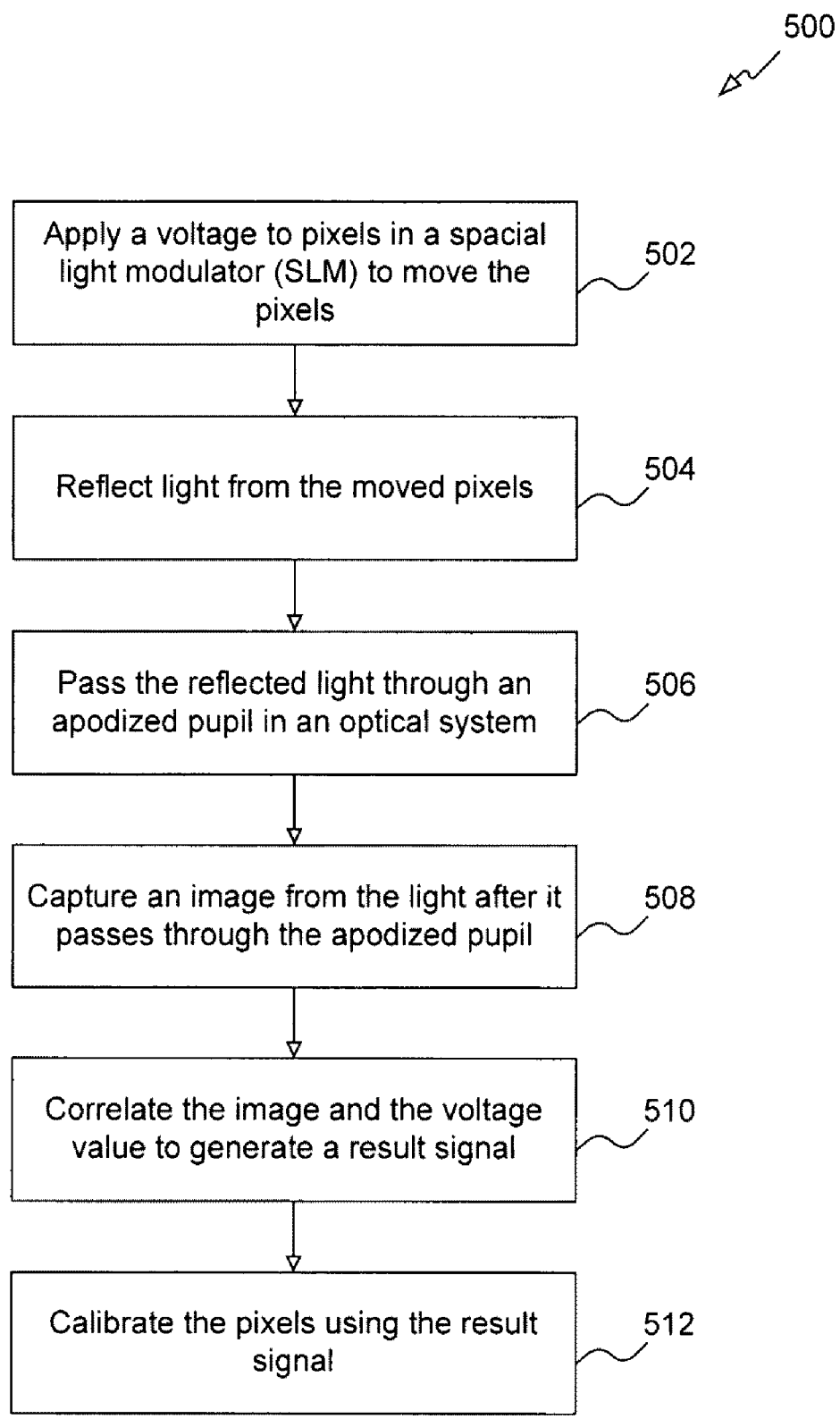
FIG. 5 shows a flowchart depicting a method for calibrating an SLM according to an embodiment of the present invention.

FIG. 5 shows a flowchart depicting a method 500 according to an embodiment of the present invention. Method 500 can be performed by one or more of the systems described below, however system 600 (FIG. 6) and elements system 600 will be used in this section as an exemplary system performing method 500.

In step 502, a voltage (having a voltage value) is applied to pixels in a spatial light modulator (SLM) to move the pixels.

In step 504, light is reflected from the moved pixels. In step 506, the reflected light is passed through an apodized pupil in an optical system. In step 508, an image from the light is captured after it passes through the apodized pupil. In step 510, the image and the voltage value are correlated to generate a result signal. In step 512, the pixels are calibrated using the result signal.

The real micro-mirror does not tilt as a solid body. Thus, the principal effect on the image of the pixel comes from the "mean tilt" of the micro-mirror. Curling and non-planarity of the tilted mirror are smaller than the size of the mirror, and thus, mostly affect the higher-order diffraction orders from the mirror. The image of the pixel by the imaging projection optical system, on the other hand, mostly depends on the shape of the zero diffraction order and its displacement as a function of a tilt. Method 500 allows calibration of the principal effect (tilt).

It is to be appreciated that, although the residual (after tilt) pixel surface deformation may be significantly affecting the pixel image for 16 μm aluminum pixels, smaller (e.g., 8 μm) and thicker pixels can also be used. These smaller and thicker pixels deform less while tilting. Thus, the error of the calibration due to the pixel deformation is smaller.

It is to be appreciated that the above description was assuming that the actual tilt of pixels occurs around the tilt axes which are absolutely parallel between themselves. However, the mirror pixels in some SLM pixel mirrors can tilt around the axes that are slightly non-parallel. Method 500 can be used to calibrate the dependence of both x and y tilts of every mirror when the above described calibration procedure is performed twice, once as described and then with the apodization pattern rotated by 90 degrees.

It is to be appreciated that method 500 can include additional steps depending on the calibration result sought.

Figure 6:
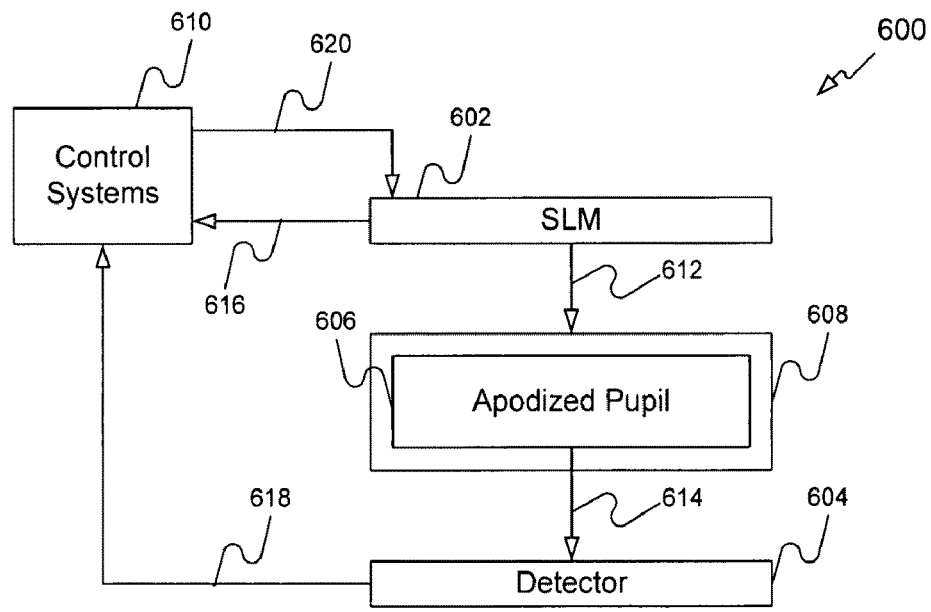
FIG. 6 shows a system according to an embodiment of the present invention.

In one example, which is used to obtain the tilt versus the voltage calibration curve, additional steps can include: (1) various voltages can be applied to all pixels of the SLM 602 (FIG. 6) simultaneously and the images obtained from the calibration projection optical system 608 (FIG. 6) are measured by detector 604 (FIG. 6); (2) the portion of the image corresponding to a specific resolved pixel is then used in order to find the dependence of the tilt of this individual pixel on the applied voltage; and (3) knowledge of the dependence of the pixel image intensity on the tilt of this pixel is use, which can be derived analytically or experimentally.

In another example, a set of voltages that will tilt each pixel by the prescribed tilt angles is determined. In one embodiment, the tilt versus the voltage calibration curve for each pixel is obtained and interpolation is performed for the values of prescribed tilt angles. To perform such interpolation, system 600 only needs to determine a tilt versus voltage calibration curve in the vicinity of the values of the prescribed tilts. In another embodiment, iterations are performed for each pixel. Because images from the pixels are well resolved, these iterations can be performed for each pixel separately in order to quickly converge the values.

System for Calibrating an SLM

FIG. 6 shows a system 600 according to an embodiment of the present invention. System 600 can be positioned within any of systems 100, 200, or 300, or any other system using an SLM now known or developed in the future. System 600 can include an SLM 602, a detector 604, an apodized pupil filed 606 in a projection optical system 608, and a control system 610. In this embodiment, SLM 602 is a reflective SLM. Each light beams 612 reflecting from each pixel (e.g., mirrors, reflective surfaces, or the like) (not shown) in at least a subset of pixels of SLM 602 are directed through projection optical system 608. Light beams 614 that have been changed through use of apodized pupil 606 are detected at detector 604.

During calibration, one or more values 616 corresponding to one or more voltage values used to tilt or move individual pixels to one or more desired angles are transmitted to control system 610, as described in more detail below. Also, image data 618 (e.g., a light intensity value, or the like) of light beams 614 corresponding to each of pixels at the desired angle(s) is transmitted to control system 610, as is described in more detail below. After correlating and indexing each voltage value 616 with image data 618 for each pixel and each angle, control system 610 generates a control signal 620 to control each pixel during operation of system 600, as is described in more detail below.

System 600 can be used to substantially simultaneously individually calibrate each SLM pixel through imaging all pixels of an SLM 602 (e.g., a DMD SLM 402 or possibly a GLV SLM) using a detector 604 (e.g., a charge coupled device (CCD), a complimentary metal field oxide device (CMOS), or the like).

During a calibration cycle, which can occur before normal operations begin and possibly at any desired interval during normal operations, the images of the pixels are individually resolved via an apodized pupil 606 in a projection optical system 608. A voltage value 616 used to tilt each pixel and a image light intensity value 618 for each pixel are received in a control system 610, which correlates these two data values for each pixel and generates a result signal 730 therefrom. Result signal 730 is used during normal operation to calibrate and accurately tilt or move the mirrors. Using apodized pupil 606 can allow for an image light intensity value 618 of each pixel to depend strongly on a tilt angle (i.e., voltage value 616) of each mirror of the DMD SLM 602, as will be described in more detail below.

Figure 7:
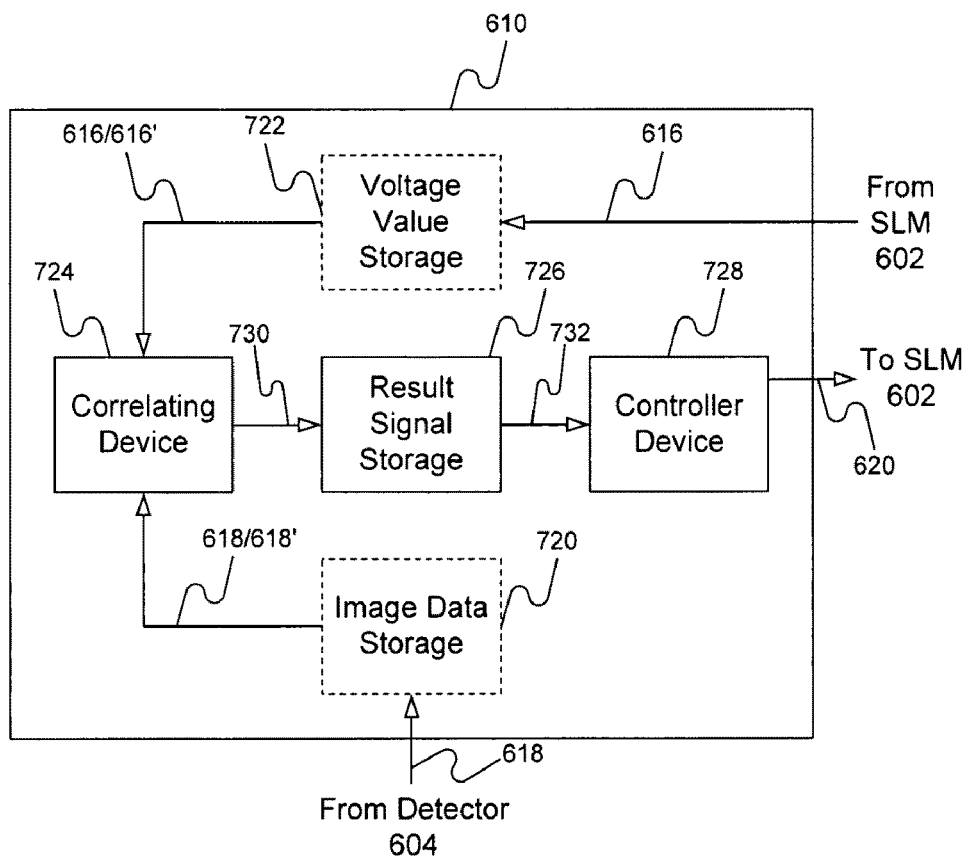
FIG. 7 shows a block diagram of a control system in the system of FIG. 6.

FIG. 7 shows a block diagram of control system 610 according to an embodiment of the present invention. Control system 610 includes a correlating device 724, a result signal storage 726, and a controller device 728. Optionally, when storage of signals 616 and/or 618 is desired, a image data storage 720 and a voltage value storage 722 are also included in control system 610. Storage devices 720, 722, and/or 724 (and/or 726 discussed below) can be implemented using any hardware or software storage device now known or developed in the future that can be used to store indexed data. Also, control system 610 can be implemented in hardware, software, or firmware, as would be apparent to a skilled artisan upon reading this description.

In one embodiment, image data storage device 720 receives and indexes a plurality of image light intensity data values 618 and voltage value storage device 722 receives and indexes a plurality of voltage values 616. For example, the mirrors (pixels) of SLM 602 can be incrementally or continuously tilted through application of voltage value(s) 616, causing image light intensity data value(s) 618 to be generated from detector 604. For each angle of tilt of each pixel (e.g., each voltage value 616), an image light intensity data value 618 is generated and stored.

Correlating device 724 correlates each voltage value 616 or indexed voltage value 616' (hereinafter only 616 will be used for both) for each tilt angle for each pixel with each image light data value 618 or indexed image light data value 618' (hereinafter only 618 will be used for both) produced by the tilt angle for each pixel to produce a result signal 730 for each correlation. This correlation operation is done regardless of whether or not image data storage 720 and/or voltage value storage 722 are included in control system 610.

One or more result signals 730 are stored and indexed in result signal storage 726. Control device 728 extracts indexed result signals 732 during normal operation of SLM 602 to generate control signals 620 that are used to calibrate and accurately position each pixel for a desired light pattern. If an angle of tile for a pixel is desired that was not stored during the calibration, a interpolation technique can be used to determine a proper voltage for that desired angle. For example, an interpolation algorithm can be used that take data for two known angles to calculate data for a desired angle, as would be apparent to a skilled artisan upon reading this description.

Figures 8, 9, 10:
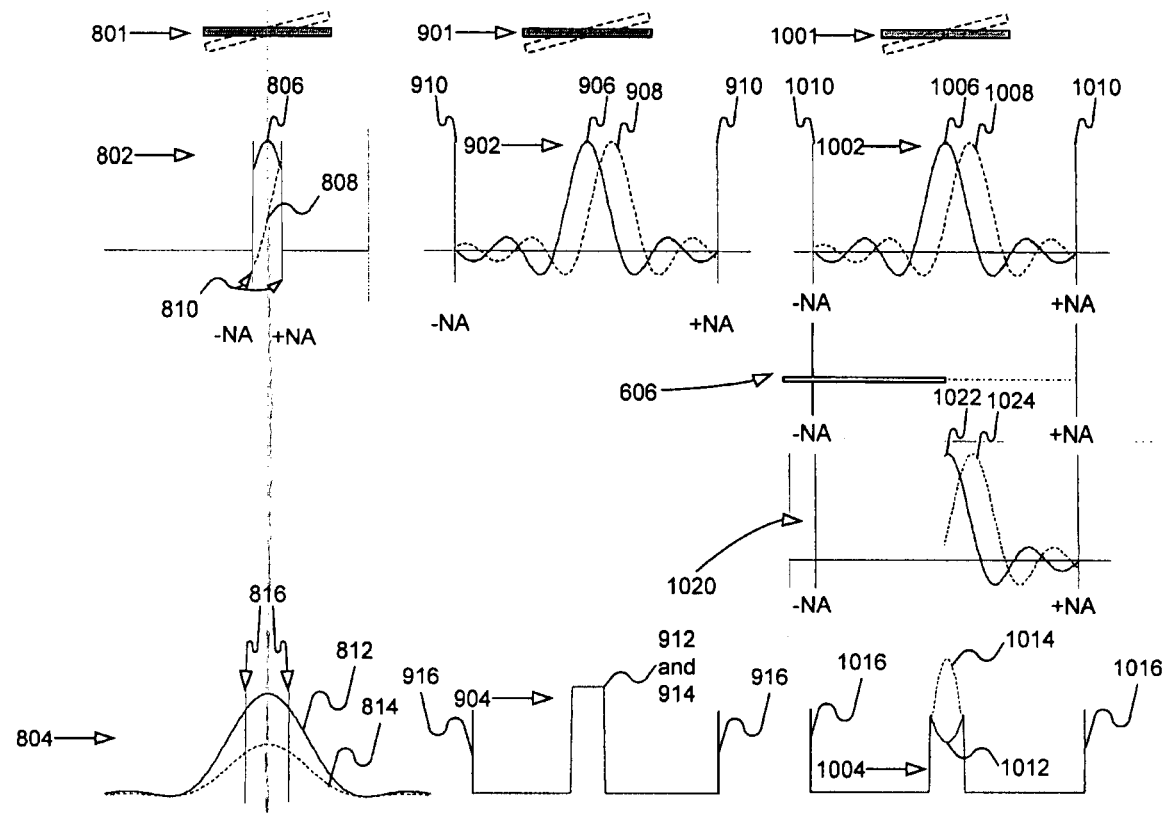
FIGS. 8 and 9 show graphs of light intensity leaving an SLM and a graphs of image light intensity at a detector according to the present invention.
FIG. 10 shows a graph of light intensity leaving an SLM, an apodized pupil, a graph of light intensity in the apodized pupil, and a graph of an image light intensity variation at a detector according to an embodiment of the present invention.

Apodization is a way of modifying pupil 606 of projection optical system 608 (as best seen in FIG. 10) through introduction of an object having varying transmittance or varying phase. If a proper transmittance and/or phase varying apodization is introduced in the pupil, this apodization can be selected so as to allow the modulation of the resolved image of the pixel with the tilt of the pixel mirror. Principal requirements to an entrance pupil apodization function are as follows: (1) the apodization function should result in a strong dependence of the pixel image intensity on the tilt of the corresponding pixel mirror, and (2) the apodization function should not significantly reduce the resolution capability of the calibration projection optical system 608. It is also desirable that apodization does not result in significant field distortions. The following are exemplary apodization patterns satisfying these requirements, however this is not to be construed as an exhaustive list. It is to be appreciated other apodization patterns now known or developed in the future can be used within the scope of the present invention.

The exemplary patterns are: (1) an annular apodization blocking a portion of the zero order lobe of the pixel diffraction pattern; (2) a semi-plane, or a single edge apodization function (knife edge); (3) a shearing grating or diffraction grating apodization function; (4) shearing of the field in the image plane allowing to use shearing interferometry for the SLM calibration can be achieved utilizing many physical arrangements other than a shearing grating, known to those skilled in the art (e.g., beam dividers, special prisms or mirrors can be used); (5) lateral shearing interferometry, for example as is described in U.S. Ser. No. 10/765,947 entitled "System And Method For Pistoning A Micromirror Spatial Light Modulator Array Using Shearing Interferometry," filed Jan. 29, 2004, now U.S. Pat. No. 6,847,461, which is incorporate herein by reference in its entirety; and (6) a more general apodization function resulting from the computational, analytical or ad-hoc solution of the constrained optimization problem (based on the principal requirements to an entrance pupil apodization function), which can include the variations in both transmittance and phase or the apodization function may include only the phase variation (e.g. a phase shear grating, or an edge alternating the phase by pi).

In one example:

Apodized pupil field:

$$U^{(p)} = a(f_x) \cdot \text{sinc}\left(L \cdot \left(f_x + \frac{2\alpha}{\lambda}\right)\right),$$

where $\alpha$ is a tilt angle, $-NA/\lambda \leq f_x \leq NA/\lambda$.

Image intensity:

$$I^{(i)}(x, \alpha) = |FT(U^{(p)})|^2.$$

Resolution for the tilt angle $\alpha = \alpha_1$:

$$R(a) = \frac{\int_{-L/2}^{L/2} I^{(i)}(x, \alpha_1) dx}{\int_{-\infty}^{\infty} I^{(i)}(x, \alpha_1) dx},$$

Sensitivity (absolute) to tilt near the tilt angle $\alpha = \alpha_1$:

$$S(a) = \left| \frac{d}{d\alpha} \int_{-L/2}^{L/2} I^{(i)}(x, \alpha_1) dx \right|$$

We want to find an apodization function $|\alpha(f_x)| \leq 1$, so that the values of the $R(\alpha)$ and $S(\alpha)$ functionals are as high as possible.

Some optimization problems resulting from these requirements include:

1. Find $|\alpha(f_x)| \leq 1$, so that $c_1 \cdot R(\alpha) + c_2 \cdot S(\alpha) \rightarrow \max$.

2. Find $|\alpha(f_x)| \leq 1$, so that $S(\alpha) \rightarrow \max$, subject to $R(\alpha) \geq 1-c$.

3. Find $|\alpha(f_x)| \leq 1$, so that $R(\alpha) \rightarrow \max$, subject to $S(\alpha) \geq c$.

If a shearing grating apodization pattern is used, the modification of the shearing interferometer principle can be applied for this purpose to calibrate SLM 602. The shearing grating should be placed in the pupil 606 so that it shears the field in the image plane. The resultant fringes in the pixel image can be analyzed to give pixel tilt.

One option is to choose the shear so that it shears the image by an integer number of the pixel widths. Then the resolved image of each pixel will overlap with the image of the neighboring pixel and one can judge about the true modulated state of the pixel by reading the resulting fringe interferogram. Thus, this approach is based on pixels interfering with each other.

Another option can be as follows. The SLM is imaged so that the individual pixels are well resolved. The shearing grating is introduced in pupil 606 of projection optical system 608 so that its shears (in the image plane) by a fraction (e.g., ¼) of a pixel width. Then, near the center of each pixel's image there is an area (½ of the pixel width wide) where the shear is mostly applied to the field within this pixel (no interference with the neighbors). Within this area, the intensity for a fixed value of a pixel mirror tilt will be close to a constant (because of the linear phase variation resulting from the tilt) and proportional to cos(A*tilt) (where A is a certain known constant), where the tilt is the tilt of this pixel.

A partially coherent illumination may be needed to reduce the effect of flare in the projection optical system 608 or a speckle observed with coherent illumination. A partially coherent illumination will reduce the modulation resulting from the apodization in the pupil. For a particular case of a periodic pupil apodization pattern (e.g., shearing grating), this can be countered by providing the partially coherent illumination from an extended source that is modulated by a grating with a period that matches the period of the apodization pattern (similarly to the use of matching pair of Ronchi gratings in a shearing interferometer), as would be apparent to one or ordinary skill in the art upon reading this description.

If the pixels are not resolved well and there is still some interference between the pixels, it may be possible to account for this interference using a calibration algorithm. The calibration will thus be "global". The pixels can be resolved and the interference between the pixels may be small, so that the interference can be accounted for as an iterative correction to the initial guess made in the assumption of the perfectly resolved pixels. When the interference between pixels is weak, the resulting problem is expected to be well-conditioned and the iterations are quick to converge.

For example, if there are N pixels in an SLM to be calibrated. Each pixel is driven by a voltage, applied to it. Consider the vector of voltages, corresponding/applied to each pixel: $V=[V_1 \; V_2 \ldots V_N]^T$. These voltages correspond to the tilts of the SLM pixel mirrors $\alpha=[\alpha_1 \; \alpha_2 \ldots \alpha_N]^T$. The image of an SLM is further obtained on a CCD array resulting a set of CCD array readings $D=[D_1 \; D_2 \ldots D_N]^T$, each value being the result of a measurement over the area occupied by a geometrical image of the corresponding pixel. We want to determine, for each pixel, the dependence between the voltage applied to this pixel and the resulting tilt of the pixel mirror: $\alpha_i=\alpha_i(V_i)$, $i=1, \ldots, N$ In a first example, there may be well-resolved pixels and no need for iterations. In this case, the CCD array reading for each pixel depends only on the tilt of this pixel: $D_i=D_i(\alpha_i)$, $i=1, \ldots, N$, and this dependence is known in advance. It can, for instance, be obtained from the aerial image simulations or analytically. This dependence can be generally inverted (locally or even globally) yielding the dependence of the tilt angle on the CCD reading value: $\alpha_i=\alpha_i(D_i)$, $i=1, \ldots, N$. This latter dependence can be used to determine the tilt of each pixel as a function of applied voltage.

In a second example, there may be not-so-well resolved pixels and an iterative algorithm is needed. In this case, the measured values for each pixel depend on the tilts of this pixel and its neighbors: $D_i=D_i(\alpha)$, $i=1, \ldots, N$. In order to determine the dependence of the tilt of each pixel mirror on the voltage applied to this mirror, one and the same voltage is applied to each pixel. The CCD array readings are measured for these uniform voltages and the iterations (described below) are conducted to determine the tilts of each pixel mirror. Then the value of this voltage is changed and the tilts of each pixel mirror are found for all voltage values.

For each applied voltage $V=[V_1 \; V_2 \ldots V_N]^T$ (for instance, $V=V_1=V_2= \ldots =V_N$), some reasonable initial guess $\alpha^{(0)}$ for corresponding tilts is assessed and the resulting CCD array readings $(D=[D_1 \; D_2 \ldots D_N]^T)$ are measured. Using the aerial image simulation, one can compute the CCD array readings that would result from the initial guess for the tilts $D^{(0)}=D(\alpha^{(0)})$ (which are generally different from the measured readings) and also the Jacobian matrix $J(\alpha^{(0)})=D'_\alpha(\alpha^{(0)})$ (also known as the matrix of the 1$^{st}$ derivatives or the sensitivities). Using these quantities, obtained from the aerial image simulations, the linearized correction to the initial guess can be computed to obtain the next (1$^{st}$) iteration:

$$\alpha^{(1)}=\alpha^{(0)}+(J(\alpha^{(0)}))^{-1}(D-D(\alpha^{(0)}))$$

The iterations can then be repeated until convergence:

$$\alpha^{(k+1)}=\alpha^{(k)}+(J(\alpha^{(k)}))^{-1}(D-D(\alpha^{(k)})),$$

where for each iteration, $D(\alpha^{(k)})$ and $J(\alpha^{(k)})$ need to be recomputed using aerial image simulation. These iterations are performed entirely via the simulation, no physical iterations (on the hardware) are necessary.

After the iterations converge, one obtains $\alpha^{(final)}$, containing the tilts of each pixel, corresponding to the applied voltage.

In other words, when the pixels are not so well resolved, the iterations can be used to resolve the interference between the neighboring pixels. Because the suggested method is based on making the resolution as good as possible, the interference between the neighboring pixels should be a relatively small effect and the iterations described above should be fast to converge.

Depending on the apodization pattern, the calibration algorithm may have better accuracy for tilt angles within a certain range (a calibration sweet spot). It may be possible to extend this sweet spot by shifting the apodization pattern in the pupil by the distance corresponding to the current tilt, so that the current tilt is always near the sweet spot. Another way to implement this is to leave the apodization pattern steady, but tilt the illumination, so that field in the pupil shifts with respect to the apodization pattern to stay within the sweet spot.

In another embodiment, a technique similar to phase-stepping used in shearing interferometry techniques (e.g., techniques based on a shearing grating) can be applied to an image obtained with a generic apodization pattern (e.g., a knife edge, or (semi)annular apodization or others). Namely, for each value of the commanded tilt of all mirrors, several measurements should be taken. In each measurement, the apodization pattern is shifted by a certain distance. For each pixel, these measurements will result in a dependence of a measured intensity versus the shift parameter. From this dependence, a tilt of the pixel can be computed with a better accuracy than in the case of a single measurement.

For example, in the referred shearing interferometry techniques, the shearing grating can be shifted in certain steps in the direction perpendicular ton the grating lines by one grating pitch. For each such grating position, the shearing interferogram is measured. The result of such process (called phase stepping) is a family of interferograms. Instead of analyzing a single shearing interferogram to determine the wavefront aberration, the phase stepping technique works with the measured family of the phase-stepped interferograms. Phase stepped interferograms allow separation of interference caused by the higher-order diffraction orders from the grating, and also increases the accuracy of measurements because there are multiple measurements at every point in the field.

In regards to the distance of the shifting of the of a generic pattern, the distance depends on a particular pattern being used. For example, a grating can be shifted by no more than its period because the measurements will just be repeating itself if it is shifted by more than a period. With non-periodic patterns, the shift of the pupil apodization pattern can be arbitrarily large (within the pupil), but it is preferable to shift the pattern so that these shifts result in the strongest possible changes in the pixel image. For example, when a knife edge is used one possibly preferred magnitude of shift of the knife edge is such that the knife edge shifts between the current position maximum of the 0th order lobe of the diffraction pattern in the pupil and the current position of the first zero in the diffraction pattern.

In a still further embodiment, interference can be reduced through calibrating of the pixels in parts. For example, a chessboard pattern can be used to calibrate first white pixels and then black. Another example is when the apodization pattern is one-dimensional (1D). In this case, one set of pixel image edges is well resolved (either vertical or horizontal). In yet another example, calibration can be done on first even and then odd columns to reducing the effect of interference between pixels on calibration.

Another way to reduce the influence of interference between the pixels on the calibration can be to establish exclusion zones near the edges in the image of the pixel. As a result, for each pixel, only the intensity close to the center of its image is measured, while the intensity near the edges (affected by the neighboring pixels) is ignored. For certain apodization patterns, exclusion zones may need to be applied only near some of the pixel edges. For instance, if the pixel mirror tilts around the Y axis and the apodization is a shearing grating with lines parallel to the Y axis, the edges of the pixel image parallel to the X axis will be resolved well, but larger smearing will occur near the edges parallel to the Y axis. Therefore, wider exclusion zones will need to be applied near the Y edges.

A still further embodiment can be to provide the reference wave to resolved pixels using a Michelson interferometer within the calibration optics and a source envelope.

Light Intensity at Various Locations for Varying Pixel Tilt

Throughout the description of FIGS. 8-10, an image (e.g., light intensity) of a pixel being well resolved or not resolved by a projection optical system is determined by how much of the image falls within a geometrical image (geometrical size) of the pixel at a detector plane. Being well resolved means that the image from the pixel falls substantially completely within the geometrical image, such that images from adjacent pixels will substantially not overlap (interfere) at all. Also, a good modulation of the images from the pixels will result in a clear distinction between an image produced at the detector plane when the pixel is at a default angle compared to an image produced at the detector plane when the pixel is at another angle. It can be desired that there be variance in image light intensity at the detector plane. Although only one pixel is shown in each figure, it is to be appreciated this is true of all pixels in SLM 602.

FIGS. 8 shows a graph 802 of light intensity at a projection optics pupil plane and a graph 804 of light intensity at a detector plane. These graphs 802 and 804 depict when an image from SLM pixel 801 is not resolved by a projection optical system (not shown), but when the projection optical system allows for modulation of the image.

In graph 802, a solid line 806 is light intensity of a default position of pixel 801 and the dashed line 808 is light intensity of pixel 801 when tilted or moved to a desired angle. Lines 810 represent a portion (+/− one numerical aperture (NA)) of the pupil captured by the projection optics. The modulation of light is shown by the varying light intensity value between lines 806 and 808 during tilt.

In graph 804, a solid line 812 is a light intensity of a default position of pixel 801 and the dashed line 814 is a light intensity of pixel 801 when tilted to the desired angle. The lack of resolution is shown by an amount of each curve that exceeds a size of a geometrical image of pixel 801, depicted as being between vertical lines 816. Thus, there is no resolution because the projection optical system captures only a small fraction of the image produced by pixel 801.

FIGS. 9 shows a graph 902 of light intensity at a projection optics pupil plane and a graph 904 of light intensity at a detector plane. These graphs 902 and 904 depict when an image from SLM pixel 801 is well resolved by a projection optical system (not shown), but when the projection optical system does not allow for modulation of the image. Thus, although the image from pixel 901 is well resolved, the image is not sensitive to moving of pixel 901.

In graph 902, a solid line 906 is light intensity of an image from pixel 901 when pixel 901 is at a default position and a dashed line 908 is light intensity of an image of pixel 901 when pixel 901 is tilted to a desired angle. Lines 910 represent a portion (+/− one numerical aperture (NA)) of the pupil captured by the projection optics, which is larger than in FIG. 8 to allow for the full resolution of pixel 901. There is no modulation because an amount of light going through the projection optics changes very little during varying tilt angles of pixel 901 (e.g., a same light intensity value results for lines 906 and 908).

In graph 904, a solid line 912 is a light intensity of an image produced when pixel 901 is at the default position and a dashed line 914 is a light intensity of an image produced when pixel 901 it tilted at the desired angle. A geometrical image of pixel 901 is shown as being between vertical lines 916. Although there are two lines 912 and 914, because of the lack of modulation, the lines overlap in graph 904.

Thus, in FIG. 8 the projection optical system allowed for modulation, but provided low resolution of images for each pixel 801, while in FIG. 9 the projection optical system allowed for well resolved pixel images, but very little modulation. In contrast, system 600 of the present invention uses projection optical system 608 including apodized pupil 606, which can allow for both well resolved pixel images and modulation of each pixel image, as was described above and below in reference to FIG. 10.

FIG. 10 shows a graph 1002 of light intensity of an image produced by a pixel 1001 at a plane just below pixel 1001, an apodized pupil (e.g., an example of apodized pupil 606), a graph 1020 of light intensity of an image from pixel 1001 at an apodized pupil plane, and a graph 1004 of an image light intensity variation of an image from pixel 1001 at a detector plane according to an embodiment of the present invention.

In graph 1002, a solid line 1006 is light intensity of an image from pixel 1001 when pixel 1001 is at a default position and a dashed line 1008 is light intensity of the image of pixel 1001 when pixel 1001 is tilted at a desired angle. Lines 1010 represent a portion (+/− one numerical aperture (NA)) of the pupil captured by projection optical system 608 (not shown in this figure), which is similar in size to FIG. 9 to allow for the full resolution of the image from pixel 1001.

In graph 1020, a result of the image passing through apodized pupil 606 is shown. Basically, half of the image for the default pixel position line 1022 and tilted pixel position line 1024 are blocked by the apodized pupil 606, as compared to lines 1006 and 1008. This results in graph 1004, which shows a geometrical image of pixel 1001 being between vertical lines 1016, a solid line 1012 for a light intensity of the image for a default position of pixel 1001, and a dashed line 1014 for a light intensity of an image of pixel 1001 tilted at a desired angle. Thus, because lines 1012 and 1014 fall completely within lines 1016, each of the images from of each of the pixels 1001 is well resolved. Because lines 1012 and 1014 have different intensity values, the images of the varying tilt angles for pixel 1001 are modulated with respect to each other.

If the individual pixel is well resolved, most of the light reflected from the corresponding pixel mirror will be concentrated within the area of the image of this pixel. Thus, in one embodiment one section of detector 604 (e.g., one CCD cell) can be used to receive each pixel image. However, in other embodiments, each pixel image can be received by more than one section of detector 604 (e.g., several CCD pixels). In this case, distribution of intensity inside the pixel image can also be measured. This distribution of intensity will provide additional information and it is possible to design the calibration algorithm with improved accuracy basing on utilization of this additional information.

Instead of, or in addition to, the entrance pupil apodization 606, special illumination modes can be used to ensure that tilting the pixel imaged by the calibration projection optical system 608 that well resolves individual pixels results in the pixel image that modulates with the tilt.

Figure 11:
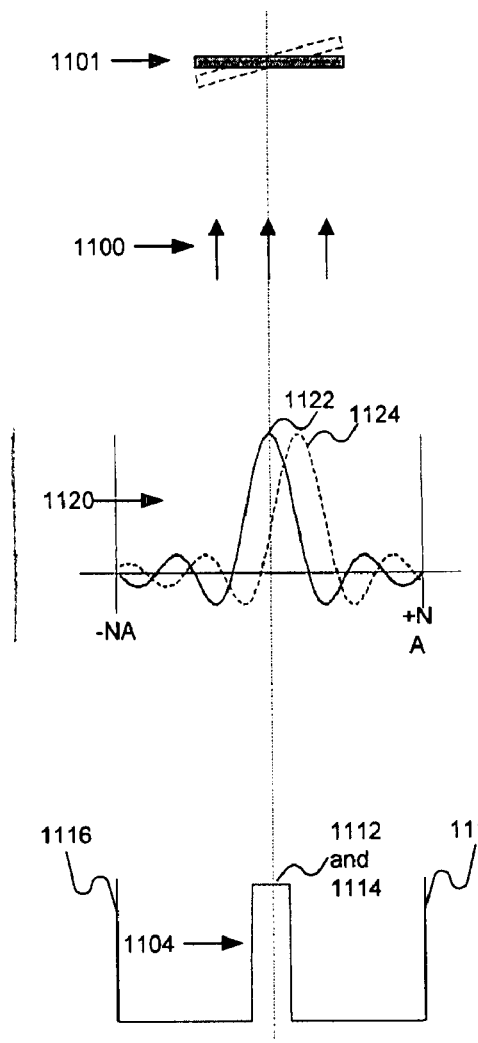
FIG. 11 shows a graph of light intensity at a pupil and a graph of an image light intensity variation at a detector.

FIG. 11 shows a graph 1120 of light intensity of an image from pixel 1101 at a pupil plane and a graph 1104 of an image light intensity variation of an image from pixel 1101 at a detector plane when light beams 1100 are incident on pixel 1101 in the direction shown. These graphs 1104 and 1120 depict when an image from SLM pixel 1101 is well resolved by a projection optical system (not shown), but when the projection optical system does not allow for modulation of the image. Thus, although the image from pixel 1101 is well resolved, the image is not sensitive to moving of pixel 1101.

In graph 1120, a solid line 1122 is light intensity of an image from pixel 1101 when pixel 1101 is at a default position and a dashed line 1124 is light intensity of an image of pixel 1101 when pixel 1101 is tilted to a desired angle. There is no modulation because an amount of light going through the projection optics changes very little during varying tilt angles of pixel 1101 (e.g., a same light intensity value results for lines 1122 and 1124).

In graph 1104, a solid line 1112 is a light intensity of an image produced when pixel 1101 is at the default position and a dashed line 1114 is a light intensity of an image produced when pixel 1101 it tilted at the desired angle. A geometrical image of pixel 1101 is shown as being between vertical lines 1116. Although there are two lines 1112 and 1114, because of the lack of modulation, the lines overlap in graph 1104.

Figure 12:
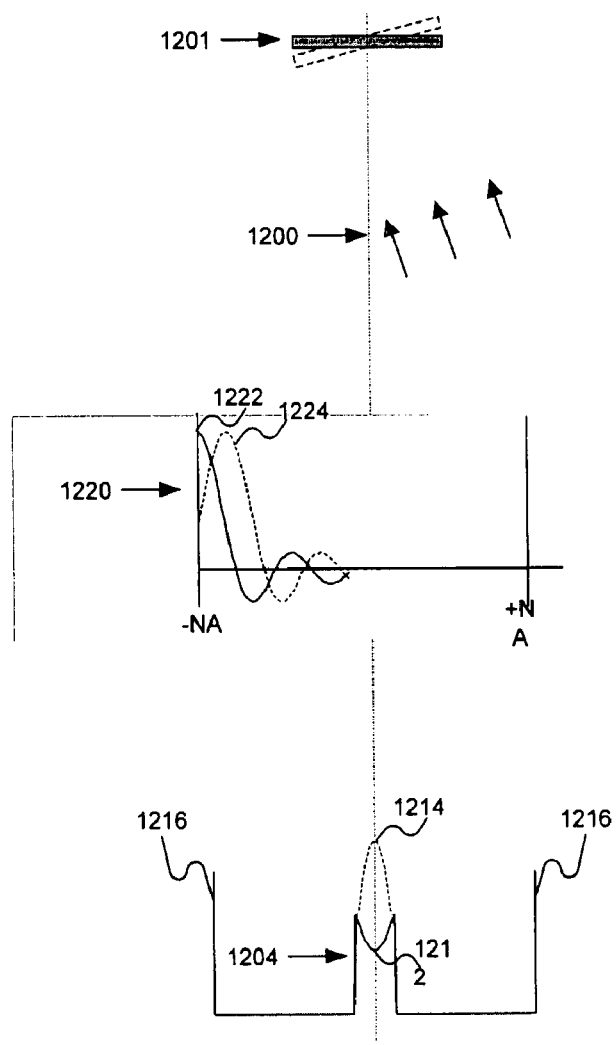
FIG. 12 shows a graph of light intensity at a pupil and a graph of an image light intensity variation at a detector according to an embodiment of the present invention.

FIG. 12 shows a graph 1220 of light intensity of an image from pixel 1201 at a pupil plane and a graph 1204 of an image light intensity variation of an image from pixel 1201 at a detector plane when light beams 1200 are incident on pixel 1201 in the direction shown, according to an embodiment of the present invention. Illumination beams 1200 could be a coherent plane wave that falls onto pixel 1201 at an angle that results in the zero order of the diffraction pattern from pixel 1201 being shifted to an edge of the calibration projection optical system 608 entrance pupil (off-axis monopole Kohler illumination with sigma=1).

In graph 1220, a result of the image being formed in the pupil with incident light 1200 hitting pixel 1201 at an angle is shown. Basically, half of the image for the default pixel position line 1222 and tilted pixel position line 1224 are not formed because of the angle of incidence of incident light 1200. This results in graph 1204, which shows a geometrical image of pixel 1201 being between vertical lines 1216, a solid line 1212 for a light intensity of the image for a default position of pixel 1201, and a dashed line 1214 for a light intensity of an image of pixel 1201 tilted at a desired angle. Thus, because lines 1212 and 1214 fall completely within lines 1216, each of the images from of each of the pixels 1201 is well resolved. Because lines 1212 and 1214 have different intensity values, the images of the varying tilt angles for pixel 1201 are modulated with respect to each other. In this embodiment, apodization of the pupil is unnecessary.

Exemplary Application

In the example of a maskless lithography system, resolving individual pixels and calibrating them individually and simultaneously allows for an increased accuracy in printing of lithographic features. This is done by allowing each individual pixel to be well resolved, which means that most of the light reflecting from the pixel will be concentrated within an exposure area of the image of the pixel on a substrate. Having an accurate concentration of each pixel's image light intensity decreases overlap with adjacent pixel's light intensity (e.g., interference between the pixels), which reduces smearing of adjacent features or edges of features. Thus, this can overcome conventional calibration schemes that did not resolve individual pixels but groups of pixels, which allowed for one or two pixels in a group to be mis-calibrated. Even with only one or two miscalibrated pixels, significant edge roughness of a feature can result, which can cause the feature to be beyond a tolerance for desired operation.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method comprising:
    applying individual voltages having respective voltage values to a plurality of pixels in a spatial light modulator (SLM) to move at least one pixel from the plurality of pixels to a first position and a second position;
    reflecting a first light beam and a second light beam from the at least one moved pixel in the first and second positions, respectively;
    passing the first and second reflected light beams through an apodized pupil in an optical system;
    blocking, from only one side at a time, a zero order lobe of a pixel diffraction pattern associated with the at least one moved pixel at the apodized pupil;
    capturing respective first and second images from the first and second reflected light beams after the first and second reflected light beams passes through the apodized pupil;
    correlating the first image and the respective voltage values associated with the at least one moved pixel to generate respective result signals, wherein the correlating comprises comparing the first image to the second image; and
    calibrating the plurality of pixels using the respective result signals.

2. The method of claim 1, further comprising using a charge coupled device (CCD) array to perform the capturing step.

3. The method of claim 2, wherein the image of each of the pixels is captured using more than one cell in the CCD array.

4. The method of claim 1, further comprising:
    tilting the at least one moved pixel through a plurality of desired angles; and
    performing the capturing step for each of the desired angles.

5. The method of claim 1, further comprising:
    tilting the at least one moved pixel through a set of angles;
    performing the capturing step at each angle in the set of angles; and
    using interpolation to determine a voltage value that moves the at least one moved pixel to an angle outside the set of angles.

6. The method of claim 1, further comprising forming the apodized pupil using at least one of an annular pattern and a semi-circular pattern.

7. The method of claim 1, further comprising forming the apodized pupil using at least one of a semi-plane knife edge, a shearing grating, and an algorithm derived apodization pattern, such that variations in at least one of transmittance and phase is present in the first reflected light.

8. The method of claim 1, wherein the image of each of the plurality of pixels is captured using one cell in a CCD array.

9. A system comprising:
- a voltage value storage configured to transmit individual voltages having voltage values to corresponding individual pixels in a spatial light modulator (SLM) to move the individual pixels to a first position and a second position;
- a semi-plane knife edge device configured to apodize a pupil in an optical system, wherein the semi-plane knife edge device blocks, from only one side at a time, a zero order lobe of a pixel diffraction pattern associated with each of the moved individual pixels at the apodized pupil;
- a detector configured to capture a first image and a second image corresponding to each of the moved individual pixels from a first light and a second light that has reflected off the moved individual pixels in the first and second positions, respectively, and passed through the semi-plane knife edge device;
- a correlating device configured to correlate the first image and the voltage values to generate respective result signals for each of the moved individual pixels and to compare the first image to the second image; and
- a controller configured to calibrate the individual pixels in the SLM using the respective result signals.

10. The system of claim 9, wherein the detector comprises a charge coupled device (CCD) array.

11. The system of claim 10, wherein an image of each of the individual pixels is measured using more than one cell in the CCD array.

12. The system of claim 10, wherein the image of each of the individual pixels is captured using one cell in a CCD array.

13. The system of claim 9, further comprising at least one of a shearing grating, an algorithm derived apodization pattern, an annular pattern, and a semi-circular pattern to apodize the pupil, such that variations in at least one of transmittance and phase is present in the first reflected light.

14. The system of claim 9, wherein:
- the corresponding voltage moves each of the individual pixels through a plurality of desired angles; and
- the correlating device determines result signals for each of the desired angles.

15. The system of claim 14, wherein:
- the detector captures an image at each angle in the plurality of desired angles; and
- the correlating device uses interpolation to determine a third result signal for angles falling outside the plurality of desired angles.

16. The system of claim 9, wherein the optical system comprises projection optics of a lithography tool.

* * * * *